United States Patent
Shklover

(10) Patent No.: US 11,525,946 B2
(45) Date of Patent: Dec. 13, 2022

(54) METHOD FOR IN SITU PROTECTION OF AN ALUMINUM LAYER AND OPTICAL ARRANGEMENT FOR THE VUV WAVELENGTH RANGE

(71) Applicant: Carl Zeiss SMT GmbH, Oberkochen (DE)

(72) Inventor: Vitaliy Shklover, Heidenheim (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 17/340,623

(22) Filed: Jun. 7, 2021

(65) Prior Publication Data

US 2021/0293998 A1  Sep. 23, 2021

Related U.S. Application Data

(63) Continuation of application No. PCT/EP2019/083621, filed on Dec. 4, 2019.

(30) Foreign Application Priority Data

Dec. 7, 2018 (DE) .......................... 102018221188.4

(51) Int. Cl.
 *C23F 1/02* (2006.01)
 *H01L 21/3065* (2006.01)
 (Continued)

(52) U.S. Cl.
 CPC .................. *G02B 1/14* (2015.01); *C23F 1/02* (2013.01); *G02B 5/0891* (2013.01);
 (Continued)

(58) Field of Classification Search
 None
 See application file for complete search history.

(56) References Cited

U.S. PATENT DOCUMENTS

| 4,030,967 A | 6/1977 | Ingrey et al. |
| 9,984,858 B2 * | 5/2018 | Kanarik .............. H01L 21/3065 |

(Continued)

FOREIGN PATENT DOCUMENTS

| DE | 102018211499 A1 | 7/2018 |
| DE | 102017207030 A1 | 10/2018 |
| EP | 1522895 A1 | 4/2005 |

OTHER PUBLICATIONS

German Office Action, Application No. 102018221188.4, dated Jul. 9, 2019, 4 pages.

(Continued)

*Primary Examiner* — Shamim Ahmed
(74) *Attorney, Agent, or Firm* — Edell, Shapiro & Finnan, LLC

(57) ABSTRACT

A method for in situ protection of a surface (7a) of an aluminum layer (7) of a VUV radiation reflecting coating (6) of an optical element (4), arranged in an interior of an optical arrangement, against the growth of an aluminum oxide layer (8), including carrying out an atomic layer etching process for layer-by-layer removal of the aluminum oxide layer from the surface. The etching process includes a surface modification step and a material detachment step. At least one boron halide is supplied as a surface modifying reactant to the interior in pulsed fashion during the surface modification step. A plasma is generated at a surface (8a) of the aluminum oxide layer, at least during the material detachment step. The atomic layer etching process is performed until the aluminum oxide layer reaches a given thickness (D), or the aluminum oxide layer is kept below that thickness (D) by the process.

11 Claims, 2 Drawing Sheets

(51) Int. Cl.
- *G02B 1/14* (2015.01)
- *G02B 5/08* (2006.01)
- *G03F 7/20* (2006.01)
- *G21K 1/06* (2006.01)
- *H01J 37/32* (2006.01)
- *H01L 21/67* (2006.01)
- *G01N 21/95* (2006.01)

(52) U.S. Cl.
CPC ...... *G03F 7/70925* (2013.01); *G03F 7/70958* (2013.01); *G03F 7/70983* (2013.01); *G21K 1/06* (2013.01); *H01J 37/32357* (2013.01); *H01L 21/67288* (2013.01); *G01N 21/9501* (2013.01); *G01N 2201/0636* (2013.01); *H01J 2237/334* (2013.01)

(56) References Cited

U.S. PATENT DOCUMENTS

| | | | |
|---|---|---|---|
| 10,096,487 B2* | 10/2018 | Yang | C23F 4/00 |
| 2011/0139748 A1 | 6/2011 | Donnelly et al. | |
| 2018/0182634 A1* | 6/2018 | Smith | H01J 37/32899 |
| 2018/0226227 A1 | 8/2018 | Donnelly et al. | |
| 2019/0131130 A1* | 5/2019 | Smith | C23C 16/40 |
| 2020/0064748 A1 | 2/2020 | Forcht et al. | |
| 2021/0132269 A1 | 5/2021 | Forcht et al. | |
| 2022/0285163 A1* | 9/2022 | Clark | H01L 21/3065 |

OTHER PUBLICATIONS

International Search Report, PCT/EP2019/083621, dated Feb. 19, 2020, 6 pages.

Shustin, "Plasma technologies for material processing in nanoelectronics: Problems and solutions", Journal of Communications Technology and Electronics, vol. 62, No. 5, May 25, 2017, pp. 454-465.

Min et al., "Atomic layer etching of Al2O3 using B13/Ar for the interface passivation layer of III-V MOS dec", Microelectronic Engineering, vol. 110, Apr. 9, 2013, pp. 457-460.

Hennessy et al., "Enhanced atomic layer etching of native aluminum oxide for ulliaviolet optical applications", arxiv. org, Cornell University Library, Mar. 16, 2017.

Streller, et al., "Microstructuring of Si(100) by light induced dry etching in the VUV", Superlattices and Microstructurers, vol. 23, No. 2 (1998), 7 pages.

Schunjiro Shinohara, "Propagating Wave Characteristics for Plasma Production in Plasma Processing Field", Jpn J Appl. Phys. vol. 36 (1997) pp. 4695-4703.

Wilbrandt et al., "Protected and enhanced aluminum mirrors for the VUV", Applied Optics, vol. 53 (4) Feb. 2014, 6 pages.

Madden et al., "On the Vacuum-Ultraviolet Reflectance of Evaporated Aluminum before and during Oxidation", Journal of the Optical Society of America, vol. 53, No. 5, May 1963, 6 pages.

Hennessey et al., "Atomic Layer Deposition of Lithium Fluoride Optical Coatings for the Ultraviolet", Inorganics 2018, Wpages.

Greer, et al., "Enabling High Performance Mirrors for Astronomy with ALD", ECS Transations, 50(13), 2012, 8 pages.

Engelmann et al., "Challenges of Tailoring Surface Chemistry and Plasma/Surface Interactions to Advance Atomic Layer Etching", ECS Journal of Solid State Science and Technology, 4(6), 2015, pp. N5054-N5060.

Conrads et al., "Plasma generation and plasma sources", Plasma Sources Sci. Technology, 9 (2000), pp. 441-454.

Chalker, "Photochemical atomic layer deposition and etching", Surface & Coatings Technology 291 (2016), pp. 258-263.

Anders "Plasma and Ion Sources in Large Area Coatings: A Review", Surface & Coatings Technology, Feb. 2005, 42 pages.

English translation of German Office Action, Application No. 102018221188.4, dated Jul. 9, 2019, 8 pages.

* cited by examiner

METHOD FOR IN SITU PROTECTION OF AN ALUMINUM LAYER AND OPTICAL ARRANGEMENT FOR THE VUV WAVELENGTH RANGE

CROSS-REFERENCE TO RELATED APPLICATION

This is a Continuation of International Application PCT/EP2019/083621, which has an international filing date of Dec. 4, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 221 188.4 filed on Dec. 7, 2018.

FIELD OF THE INVENTION

The invention relates to a method for in situ protection of a surface of an aluminum layer of a VUV radiation reflecting coating of an optical element, which is arranged in an interior of an optical arrangement for the VUV wavelength range, against the growth of an aluminum oxide layer. The invention also relates to an optical arrangement for the VUV wavelength range, in particular an inspection system or a VUV lithography apparatus, comprising: an interior in which at least one optical element having a VUV radiation reflecting coating with an aluminum layer is arranged, and at least one gas inlet for feeding a gas into the interior.

BACKGROUND

Transmitting optical elements can only be used to a very restricted extent in optical applications in the vacuum ultraviolet wavelength range (VUV wavelength range) between approximately 110 nm and approximately 200 nm. Therefore, it is largely necessary to make use of reflective optical units in optical arrangements for the VUV wavelength range, for example for microscopy or for semiconductor inspection, for example for mask inspection or wafer inspection.

(Highly) reflective coatings for optical elements for the VUV wavelength range often comprise an aluminum layer since aluminum has a high reflectivity of approximately 0.8-0.9 or more in the VUV wavelength range. To protect the aluminum layer against oxidation, the article "Protected and enhanced aluminum mirrors for the VUV" by S. Wilbrandt et al., Applied Optics, Vol. 53, No. 4, February 2014, for example, has disclosed the practice of applying protective layers or protective coatings in the form of metal fluorides, for example in the form of $MgF_2$, $AlF_3$ or LiF, onto the aluminum layer. Without such a protective layer, a native aluminum oxide layer ($Al_2O_3$ layer) with a layer thickness of 2-3 nm forms virtually instantaneously upon contact with ambient air (cf. the article "On the Vacuum-Ultraviolet Reflectance of Evaporated Aluminum before and during Oxidation", R. P. Madden et al., J. Opt. Soc. Am. 53, 620-625 (1963)). The aluminum oxide layer absorbs radiation in the VUV wavelength range so strongly that the use of an aluminum layer without the use of a protective layer is not desirable, as a rule.

The article "Enabling High Performance Mirrors for Astronomy with ALD", ECS Trans. 50 (13), 141-148 (2013), F. Greer et al., and the article "Atomic Layer Deposition of Lithium Fluoride Optical Coatings for the Ultraviolet", Inorganics 6, 46 (2018), J. Hennessy et al., have disclosed the practice of applying layers of a mirror coating for the VUV wavelength range, for example an aluminum layer or fluoride layer, with the aid of so-called atomic layer deposition (ALD) in order to increase the density of the applied layers.

However, even in the case of irradiation under vacuum conditions, i.e., in the case of a very low oxygen or water content in the surroundings, a significant reflection loss and an increase in stray light were observed in the case of coatings with an aluminum layer as a base layer and conventionally deposited protective layers of various types.

In general, oxidic layers achieve a better protective effect than fluoridic layers. However, even the oxides with the largest bandgaps already absorb within the required (VUV) wavelength range. One solution for reducing the absorbing effect of oxides by way of the placement of oxidic layers in the minima of the electric field has been described in DE102018211499.4.

EUV applications have disclosed self-cleaning metal layers, e.g., made of ruthenium, in which the oxidation can be prevented by the addition of hydrogen. Since the reaction enthalpy of aluminum with oxygen is significantly higher than that of ruthenium, a reduction of aluminum oxide to aluminum by hydrogen alone is not possible. However, a protective layer made of ruthenium on an aluminum layer would cause absorption that is too high for radiation in the VUV wavelength range. Although the use of hydrogen renders it possible, in principle, to at least partly remove the aluminum oxide layer, i.e., to reduce the aluminum oxide to aluminum, this is very challenging from a technological point of view.

The article "Enhanced atomic layer etching of native aluminum oxide for ultraviolet optical applications", J. Hennessy et al, Journal of Vacuum Science & Technology A 35, 041512 (2017) has disclosed the removal of a native $Al_2O_3$ layer by atomic layer etching (ALE) by virtue of said layer being alternately exposed to trimethylaluminum (TMA) and anhydrous hydrogen fluoride (HF). The article proposes the removal of the $Al_2O_3$ layer by the ALE process before a fluoridic protective layer is applied to the aluminum layer. What is exploited here is that the ALD process can use the same chemistry, i.e., the alternate feeding of TMA and anhydrous hydrogen fluoride, as in the ALE process. The dominating reaction (ALE or ALD) depends on the substrate temperature and can be altered in order to let the desired process (ALE or ALD) run.

SUMMARY

It is an object of the invention to provide a method for in situ protection of an aluminum layer and an optical arrangement for the VUV wavelength range, in which a degradation of the surface of the aluminum layer and/or of components of the optical arrangement can be avoided to the greatest possible extent.

This object is achieved, according to one formulation of the invention, by a method of the type mentioned at the outset, comprising: carrying out an atomic layer etching process for layer-by-layer removal of the aluminum oxide layer, wherein the atomic layer etching process comprises a surface modification step and a material detachment step, wherein at least one boron halide, in particular $BBr_3$ or $BCl_3$, is supplied as a surface modifying reactant to the interior in pulsed fashion during the surface modification step, and wherein a preferably pulsed plasma is generated, preferably at a surface of the aluminum object layer, in the interior, at least during the material detachment step.

According to the invention, it is proposed to at least partly remove the aluminum oxide layer at an optical element in situ, i.e., in the installed state in an optical arrangement for the VUV wavelength range, in order to prevent the growth, i.e., the increase in thickness, and hence the formation of a comparatively thick aluminum oxide layer during the operation of the optical arrangement.

Layer-by-layer removal of the aluminum oxide layer is understood to mean that the aluminum oxide layer is ablated layer-by-layer down to a residual thickness that is sufficiently thin for the reflection of the optical element not to be impaired too greatly on account of the absorption of the aluminum oxide layer. Ideally, all that remains on the surface of the aluminum layer is an aluminum oxide layer that is as thin as possible, possibly only one or more atomic layers thick. This ensures that the atomic layer etching process does not ablate the aluminum layer found therebelow as this would impair the optical properties of the optical element. Ideally, the atomic layer etching process attains a dynamic protection of the aluminum layer, i.e., a stable equilibrium between the growth of the aluminum oxide layer as a result of the oxygen situated in the surroundings of the optical element and the ablation by way of the atomic layer etching process sets in at a certain thickness of the aluminum oxide layer.

An atomic layer etching process is a self-limiting process which, in a manner analogous to atomic layer deposition (ALD), is based on surface-limited reactions and in which, as a rule, only one atomic layer or a small number of (atomic) layers are ablated during a respective cycle of process steps even if the reactants are present in abundance. To ensure a self-limiting ALE process, it is typically necessary to keep the parameters of the ALE process within a specified process window, cf., for example, the article "Challenges of Tailoring Surface Chemistry and Plasma/Surface Interactions to Advance Atomic Layer Etching", S. U. Engelmann et al, ECS J. Solid State Sci. Technol. 4(6), N5054-N5060 (2015).

In an atomic layer etching process, an alternating sequence or a cycle of two process steps (A/B/A/B/ . . . ), of three process steps (A/B/C/A/B/C/ . . . ) or of more process steps is typically carried out, wherein in the case of two process steps, a first step represents a surface modification step and a temporally subsequent second step represents an etching or material detachment step. The two or possibly more successive steps are carried out following one another in time, with additional purging steps typically being carried out between the aforementioned steps in order to remove excess reactants or the reaction products that resulted from the respective reactions from the interior.

In the surface modification step, the reflective optical element, more precisely at least the surface of the aluminum oxide layer, is exposed to a surface modifying reactant, which is also referred to as a chemical precursor and which changes the surface of the aluminum oxide layer, typically being adsorbed on the surface. By way of example, the change may occur due to chemisorption, i.e., breaking of chemical bonds in the aluminum oxide layer.

After the first step, i.e., the surface modification step, the excess precursor or the surface modifying reactant are removed from the interior in which the optical element is arranged, specifically, as a rule, by being pumped off or flushed away. In the second, material detachment step, the aluminum oxide layer or the surface thereof is typically exposed to a high energetic species (free radicals, ions, photons) that detaches the chemically weakened uppermost layer(s) of the aluminum oxide layer. In this way, the detached reaction or waste products reach the interior. These waste products are likewise removed from the interior after the second step is complete, typically by extracting them by suction or by purging the chamber.

In the atomic layer etching process described here, at least one (gaseous) boron halide, preferably $BBr_3$ and/or $BCl_3$, is fed to the interior as surface modifying reactant. The inventors have found that the above-described removal of the aluminum oxide layer using HF or a fluorine-containing plasma is connected to both work protection risks and technological risks. In particular, volatile fluoridic reaction products can be formed within the scope of such an ALE process, said reaction products being deposited on components or attacking components located in the interior, for example further optical elements, and possibly leading to the degradation thereof. Instead of using HF for the ALE process, the use of a gaseous, boron trihalides, typically $BBr_3$ or $BCl_3$ but, as a rule, not $BF_3$, is proposed as these are easier to handle than fluorine compounds. Etching an aluminum oxide layer and an aluminum layer arranged therebelow using a gaseous plasma containing a trihalide and possibly chlorine is known from semiconductor technology; cf., for example, U.S. Pat. No. 4,030,967, the entirety of which is included in the content of this application by reference.

There is an energy inducing reaction, typically with a material detaching reactant, in the material detachment step. There are numerous options for supplying the energy required for the reaction at the uppermost layer of the aluminum oxide layer. By way of example, the energy can be supplied in the form of heat in order to increase the temperature at the surface.

In the method, a preferably pulsed plasma is generated in the interior, preferably at the surface of the aluminum oxide layer, at least during the material detachment step. The plasma can put the material detaching reactant into an excited energy state and/or radicals of the material detaching reactant can be formed in order to promote or facilitate the material detaching reaction at the surface.

As a matter of principle, there are numerous options for generating the plasma. The plasma sources for exciting or generating a plasma typically used in the semiconductor industry are based on the use of electric fields, for example by way of a capacitively coupled plasma, as described, for example, in the article "Plasma generation and plasma sources", H. Conrads and M. Schmidt, Plasma Sources Sci. Technol. 9, 441-454 (2000); cf., also, US 2011/0139748 A1, which describes an ALE process using a radiofrequency plasma which is generated between two electrodes. The generation of plasmas with the aid of electric fields is optimized for planar substrates (wafers). However, electrodes must not be in the way in an optical arrangement; in particular, these must not project into the beam path of the optical arrangement.

In a development, the plasma is generated as a remote plasma. Within the meaning of this application, a remote plasma is understood to be a plasma which is generated without the use of electrodes (in electrodeless fashion). As a rule, plasma sources generating remote plasma are embodied to generate propagating waves; cf., for example, the article "Propagating Wave Characteristics for Plasma Production in Plasma Processing Field", S. Shinohara, Japanese Journal of Applied Physics, 36, 4695-4703 (1997). The propagating waves serve for plasma excitation in the respective plasma gas. By way of examples, antennas, microwave starters, etc., can be used to generate propagating waves.

In one development, the remote plasma is selected from the group comprising: inductively coupled (radiofrequency) plasma, radiofrequency or microwave surface wave plasma, electron cyclotron resonance microwave plasma and helicon wave plasma. By way of example, an inductively coupled plasma can be generated with the aid of coils that are excited with a radiofrequency (RF) generator. Surface waves or a surface wave plasma can be generated with the aid of antennas or so-called launchers, which are excited in the RF or microwave wavelength range. An electron cyclotron resonance microwave plasma or so-called helicon waves can be generated with the aid of suitable antenna configurations and can be used for exciting or generating a plasma. In respect of details of plasma generation with the aid of plasma sources by the generation of propagating electromagnetic waves, reference is made to the article by S. Shinohara cited above, the entirety of which is included in the content of this application by reference. Further examples for generating plasmas with the aid of plasma sources are described in the article "Plasma and Ion Sources in Large Area Coatings: A Review", André Anders, Surface and Coatings Technology (2005), volume 200, pages 1893-1906, the entirety of which is likewise included in the content of this application by reference.

In a further variant, the surface modification step and/or the material detachment step are/is carried out during an operating pause of the optical arrangement. In particular, the entire atomic layer etching process can be carried out during an operating pause or during the operating pauses of the optical arrangement. In this way, it is possible to avoid a bothersome interaction between the VUV radiation present during the operation of the optical arrangement and the reactant or reactants of the atomic layer etching process. By way of example, an object that is inspected with the aid of the optical arrangement (e.g., a mask or wafer) or an object exposed with the aid of the optical arrangement (e.g., a wafer) can be transported or replaced during the operating pause.

At least the material detachment step is carried out while the optical element is irradiated with VUV radiation during an alternative variant. In this case, the VUV radiation itself present in the optical arrangement in any case can be used for the light-assisted or photochemical atomic layer etching. Examples for generating an energy influx into the surface for carrying out the material detachment step, which is based on the supply of radiation or light, are described in the article "Photochemical atomic layer deposition and etching" by P. R. Chalker, Surface and Coatings Technology 291, 258-263 (2016); cf., also, the article "Microstructuring of Si(100) by light induced dry etching in the VUV" by U. Streller et al., Superlattices and Microstructures 23 (2) 445-451 (1998). The power and the spectral characteristic of the radiation used for generating the energy influx are specified by the application in this case. Therefore, the etching rate is determined by the frequency of the reactant or reactants fed in pulsed fashion.

In one development, at least one material detaching reactant, which preferably contains chlorine, is supplied to the interior in pulsed fashion during the material detachment step. The reactant can be chlorine gas, can be $BBr_3$ and/or $BCl_3$, like in the surface modification step, or can be a mix of the same, etc. However, a reactant that contaminates components or structure elements (e.g., walls, holders, etc.) present in the interior or that attacks metallic components in the interior, as may be the case for fluoridic reactants, in particular for HF, should not be used in the material detachment step either. The chemical composition of the gas mixture, which comprises a respective surface modifying or material detaching reactant, should moreover suppress or at least significantly curtail the formation of nonvolatile reaction products. Fluoridic reaction products are frequently nonvolatile. This applies to $AlF_3$, in particular, which is why the use of $BF_3$ as a surface modifying reactant is disadvantageous. In addition to the material detaching or surface modifying reactants, the gas mixture fed to the interior in the surface modification step or in the material detachment step can contain hydrogen or one or more noble gases, for example.

In a further variant, the atomic layer etching process is carried out until the aluminum oxide layer reaches a thickness of less than 5 nm or the aluminum oxide layer is kept at a thickness of less than 5 nm by the atomic layer etching process. As described further above, the atomic layer etching process can be carried out during operating pauses of the optical arrangement. With the aid of measurements carried out in advance, the etching rate of the atomic layer etching process can be chosen or set such that the aluminum oxide layer is practically completely ablated during the respective operating pauses, and so only an extremely thin aluminum oxide layer still remains on the aluminum layer. In the case where the atomic layer etching process is carried out at least in part during the operation of the optical arrangement, the etching rate can likewise be set or matched to the growth rate such that a dynamic equilibrium sets in, at which the thickness of the aluminum oxide layer does not exceed above the aforementioned value. The growth rate of the aluminum layer depends on the gas composition in the interior and can likewise be measured in advance in order to suitably set the dynamic equilibrium between the growth rate and the etching rate of the aluminum oxide layer.

In a further variant, at least one property of the optical element that depends on the thickness of the aluminum oxide layer, in particular the reflectivity of the optical element, is monitored and the atomic layer etching process is adjusted (i.e., started, stopped or otherwise controlled) on the basis of the at least one monitored property. By way of example, the atomic layer etching process can be started when the reflectivity of the optical element drops below a specified value such that it becomes necessary to reduce the thickness of the aluminum oxide layer in order to not let the effectiveness of the optical arrangement deteriorate. The layer thickness can be controlled in a manner analogous or similar to the method described in EP 1 522 895 B1, in which a dynamic protective layer is applied to a mirror in order to protect the latter from etching with ions. Therein, the reflectivity of the mirror is monitored and the thickness of the protective layer is controlled on the basis of the monitored reflectivity. Depending on the type of application, the atomic layer etching process can be carried out without monitoring the optical element at predetermined time intervals. However, it is also necessary in this case to ensure that it is only the aluminum oxide layer and not the aluminum layer situated therebelow that is ablated by the atomic layer etching process.

A further aspect of the invention relates to an optical arrangement of the aforementioned type, in which the gas inlet is embodied for pulsed feed of at least one boron halide, preferably $BBr_3$ and/or $BCl_3$, into the interior, said boron halide, as a surface modifying reactant of a surface modification step of an atomic layer etching process, serving for in situ dynamic protection of the surface of the aluminum layer against the growth of an aluminum oxide layer, wherein the optical arrangement comprises a plasma source for preferably pulsed generation of a plasma in the interior, in particular at a surface of the aluminum oxide layer. For the supply of boron halide to the interior, the gas inlet typically has a gas reservoir, which serves to store the boron halide. As described further above, damage to components in the interior, as would occur if a fluoridic reactant were to be used, can be avoided when a boron halide is used for carrying out the surface modification step. Carrying out an atomic layer etching process facilitates a homogenous, layer-by-layer ablation of the aluminum oxide layer. The gas inlet is a controllable inlet which typically has a valve for the pulsed feed of the boron halide.

The gas inlet or possibly a plurality of gas inlets can be embodied to alternately feed the surface modifying reactant, the material detaching reactant or a purge gas to the interior. To this end, the gas inlet or the optical arrangement can comprise a control device which suitably controls the supply of the reactant or of the purge gas in order to let the atomic layer etching process run in the interior. In particular, it may be possible to set the rate or the mass flow of the respective reactant and/or the pulse rate in order to set, or adjust when necessary, the etching rate in the atomic layer etching process.

In one embodiment, the optical arrangement comprises a plasma source for the preferably pulsed generation of a plasma in the interior, preferably at a surface of the aluminum oxide layer. As described further above in conjunction with the method, the plasma is preferably generated in pulsed fashion during the material detachment step, within the scope of which at least one material detaching reactant, which preferably contains chlorine, is fed to the interior in pulsed fashion. The optical arrangement can comprise a control device, for example in the form of a control computer, in order to control the plasma source and the gas inlet in synchronous fashion such that the material detaching reactant is converted into a plasma state.

Preferably, the plasma source is embodied for generating a remote plasma, in particular for generating an inductively coupled plasma, a surface wave plasma, a microwave plasma, or a helicon wave plasma. As described further above, the electrodeless generation of a (remote) plasma was found to be advantageous for the present application.

In one development, the gas inlet is embodied to feed a material detaching reactant, which preferably contains chlorine, to the interior, at least during a material detachment step of the atomic layer etching process. As described further above, the material detaching reactant can be chlorine gas, a boron halide, in particular $BBr_3$ and/or $BCl_3$, or any other reactant which is suitable for ablating the layer(s) of the aluminum oxide layer modified during the surface modification step.

In one development of this embodiment, the optical arrangement comprises a light source embodied for irradiating the optical element with VUV radiation in pulsed fashion during the operation of the optical arrangement, at least during the material detachment step of the atomic layer etching process. In this case, it is possible to carry out a photochemical atomic layer etching process, in which light serves to excite the material detaching reactants such that it is possible to dispense with the above-described plasma source for generating an energy influx. In the embodiment described here, the atomic etching process is carried out during the operation of the optical arrangement, to be precise, generally in continuous fashion such that the thickness of the aluminum oxide layer permanently lies within a desired thickness range or a below a specified thickness or thickness threshold. However, such continual cleaning or such continual etching with an atomic layer etching process is also possible when use is made of a plasma source for generating an energy influx. Alternatively, the gas inlet can be controlled so as to feed the respective reactants to the interior only during the operating pauses of the optical arrangement.

Further features and advantages of the invention are evident from the following description of exemplary embodiments of the invention, with reference to the figures of the drawing, which show details basic to the invention, and from the claims. The individual features can each be implemented alone or in a plurality in any combination in one variant of the invention.

BRIEF DESCRIPTION OF THE DRAWINGS

Exemplary embodiments are illustrated in the schematic drawing and are explained in the following description. In detail.

DETAILED DESCRIPTION

In the following description of the drawings, identical reference signs are used for identical or functionally identical component parts.

Figure 1:
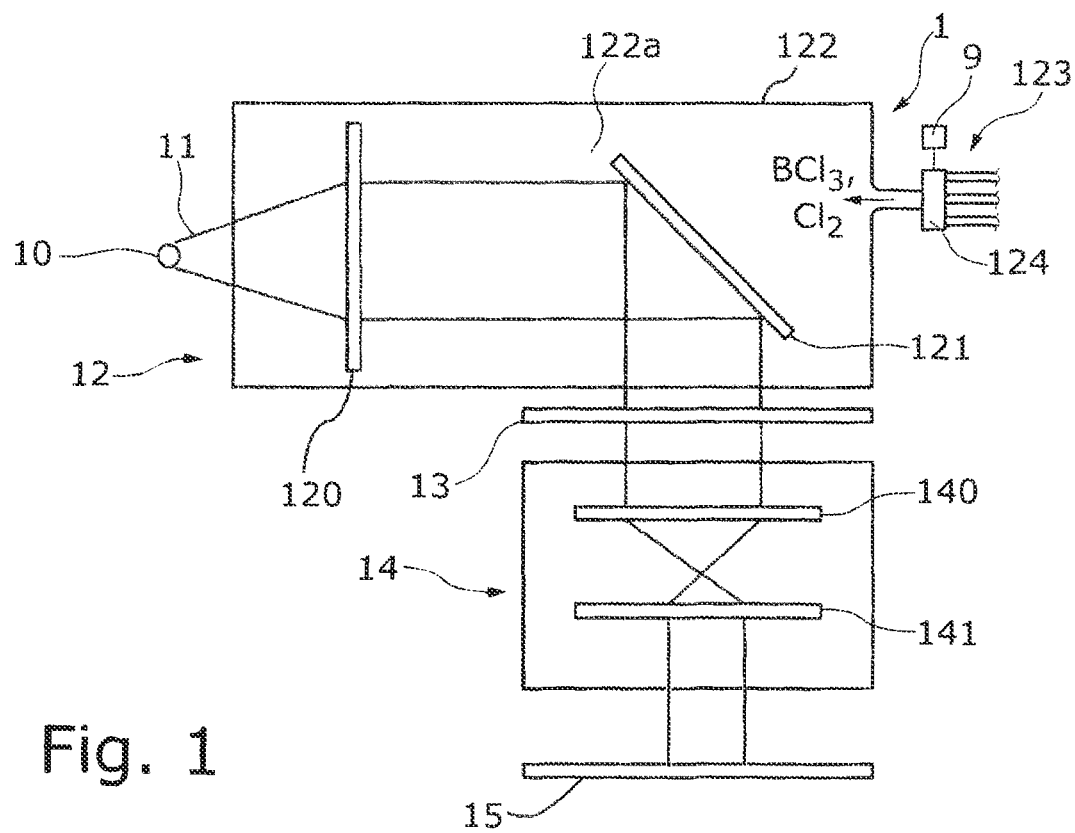
FIG. 1 shows a schematic illustration of an optical arrangement for the VUV wavelength range, in the form of a VUV lithography apparatus.

FIG. 1 schematically illustrates an optical arrangement 1 in the form of a VUV lithography apparatus, in particular for wavelengths in the VUV wavelength range between approximately 110 nm and approximately 200 nm. As basic constituent parts, the VUV lithography apparatus 1 comprises two optical systems in the form of an illumination system 12 and a projection system 14. To carry out an exposure process, the VUV lithography apparatus 1 comprises a radiation source 10, which might be an excimer laser, for example, which emits VUV radiation 11 at a wavelength in the VUV wavelength range of, e.g., 193 nm, 157 nm, or 126 nm and which can be an integral constituent part of the VUV lithography apparatus 1.

The VUV radiation 11 emitted by the radiation source 10 is conditioned with the aid of the illumination system 12 such that a mask 13, also called a reticle, can be illuminated thereby. In the example illustrated in FIG. 1, the illumination system 12 comprises both transmissive and reflective optical elements. In representative fashion, FIG. 1 illustrates a transmissive optical element 120, which focuses the VUV radiation 11, and a reflective optical element 121, which deflects the VUV radiation 11, for example. In a known manner, in the illumination system 12, a wide variety of transmissive, reflective or other optical elements can be combined with one another in any manner, even in a more complex manner. The transmissive optical element 120 and the reflective optical element 121 are arranged in an interior 122a of a housing 122 of the illumination system 12.

The mask 13 has a structure on its surface, said structure being transferred to an optical element 15 to be exposed, for example a wafer in the context of the production of semiconductor components, with the aid of the projection system 14. In the example shown, the mask 13 is embodied as a transmissive optical element. The mask 13 can also be embodied as a reflective optical element in alternative embodiments. The projection system 14 comprises at least one transmissive optical element in the example illustrated. In the example shown, two transmissive optical elements 140, 141 are illustrated in representative fashion, which serve for example to reduce the structures on the mask 13 to the size desired for the exposure of the wafer 15. In the projection system 14, too, reflective optical elements can be provided inter alia and any optical elements can be combined with one another in any known manner. It should also be pointed out that optical arrangements without transmissive optical elements can also be used for VUV lithography.

Figure 2:
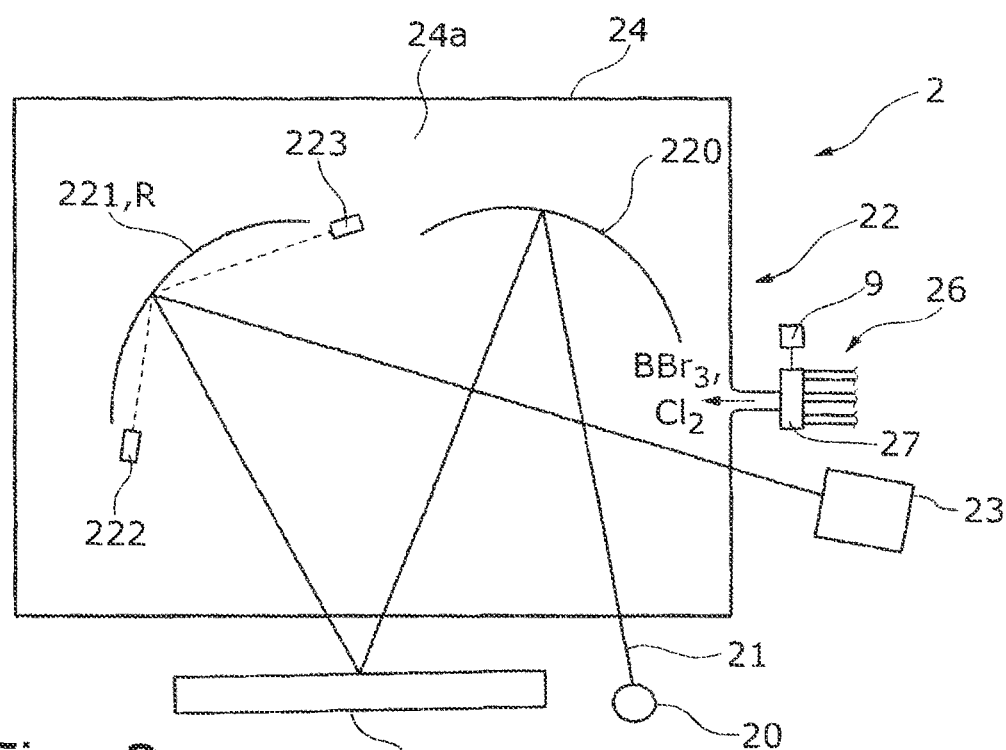
FIG. 2 shows a schematic illustration of an optical arrangement in the form of a wafer inspection system.

FIG. 2 schematically shows an exemplary embodiment of an optical arrangement in the form of a wafer inspection system 2. The explanations given below also apply analogously to inspection systems for inspecting masks.

The wafer inspection system 2 comprises a radiation source 20, the VUV radiation 21 of which is directed at a wafer 25 with an optical system 22. For this purpose, the radiation 21 is reflected from a concave mirror 220 onto the wafer 25. In the case of a mask inspection system 2, a mask to be examined could be arranged instead of the wafer 25. The radiation reflected, diffracted and/or refracted by the wafer 25 is directed at a detector 23 for further evaluation by a further concave mirror 221, which is likewise associated with the optical system 22. The optical system 22 of the wafer inspection system 2 comprises a housing 24, in the interior 24a of which the two reflective optical elements or mirrors 220, 221 are arranged.

By way of example, the radiation source 20 can be exactly one radiation source or a combination of a plurality of individual radiation sources in order to provide a substantially continuous radiation spectrum. In modifications, one or more narrowband radiation sources 20 can also be used. Preferably, the wavelength or the wavelength band of the radiation 21 generated by the radiation source 20 is in the range between 100 nm and 200 nm, particularly preferably in the VUV wavelength range between 110 nm and 190 nm.

Figure 3A:
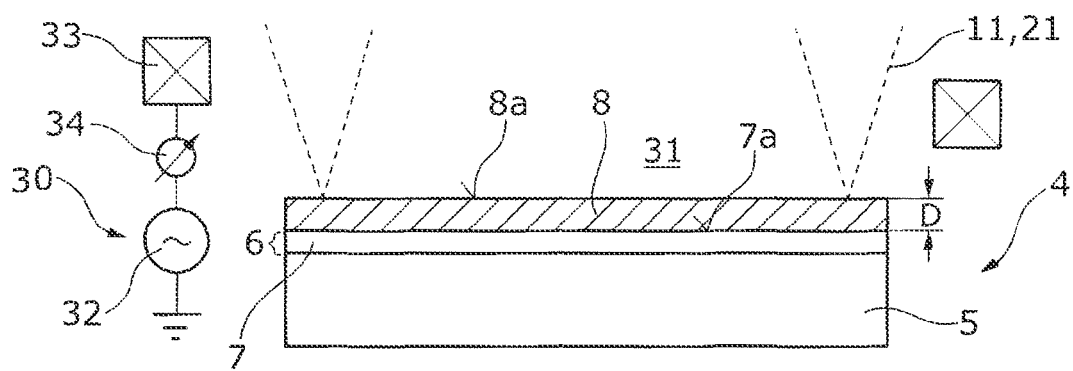
FIGS. 3A and 3B show schematic illustrations of a plasma source (FIG. 3A) and of an optical element (FIG. 3B) with a reflective coating, which comprises an aluminum layer and an aluminum oxide layer that has grown on the aluminum layer.

FIG. 3A shows an optical element 4, which is embodied to reflect radiation 11, 21 in the VUV wavelength range and which can form, e.g., one of the reflective optical elements 121, 220, 221 of FIG. 1 or FIG. 2. The optical element 4 shown in FIG. 3A is a mirror with a substrate 5, which can be a quartz (glass), in particular a titanium doped quartz glass, a ceramic, or a glass ceramic in the example shown. A reflective coating 6 has been applied to the substrate 5, said reflective coating having a continuous aluminum layer 7 which serves as a metal mirror.

The aluminum layer 7 can be applied directly to the substrate 5, as illustrated in the example shown in FIG. 3. Alternatively, a functional layer in the form of an adhesion promoter layer can be applied between the aluminum layer 7 and the substrate 5. The material of the adhesion promoter layer can be selected from a multiplicity of materials, wherein care should be taken to ensure that there is sufficient adherence to both the substrate 5 and the aluminum layer 7. Other functional layers, for example a smoothing layer and/or polishing layer, may also be provided between the aluminum layer 7 and the substrate 5.

In the example shown in FIG. 3A, a (native) aluminum oxide layer ($Al_2O_3$ layer) 8 has grown on the surface 7a of the aluminum layer 7 facing away from the substrate 5. Since aluminum oxide in contrast to aluminum has a high absorption in the VUV wavelength range, the thickness D of the aluminum oxide layer 8 should be as thin as possible; ideally, the surface 7a of the aluminum layer 7 should be completely free from aluminum oxide, i.e., the aluminum oxide layer 8 is not present in the ideal case. Since the presence of oxidizing species, as a rule oxygen-containing species, cannot be completely avoided in the respective interior 122a, 24a in which the optical element 121, 220, 221 is arranged, a comparatively thick aluminum oxide layer 8 grows on the surface 7a of the aluminum layer 7 within a comparatively short period of time.

As a matter of principle, the (native) aluminum oxide layer 8 should be removed as completely as possible from the surface 7a of the aluminum layer 7 without the surface 7a of the aluminum layer 7 being altered in the process, for example because the latter is ablated entirely or in portions. A so-called atomic layer etching process is carried out to remove the aluminum oxide layer 8, said atomic layer etching process allowing the aluminum oxide layer 8 to be ablated layer-by-layer in situ, i.e., in the installed state of the respective reflective optical element 121, 220, 221. Ideally, atomic layers are ablated in succession in this case; i.e., an isotropic etching process, which facilitates a uniform ablation of the aluminum oxide layer 8, is carried out. In a manner analogous to atomic layer deposition, the atomic layer etching process is a cyclical, self-limiting process, which will be described in more detail below on the basis of FIGS. 4A-4D. FIGS. 4A-4D illustrate a plurality of atomic layers of the aluminum oxide layer 8, which are arranged above one another, wherein the individual constituents of the aluminum oxide layer 8 are represented by filled in (black) circles.

Figure 4A:
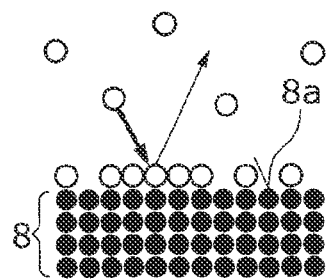
FIGS. 4A-D show schematic illustrations, respectively, of four steps of an atomic etching process for removing an atomic layer of the aluminum oxide layer.

In a first step, which is illustrated in FIG. 4A and also referred to as surface modification step, a surface modifying reactant, which is illustrated in FIG. 4A in the form of circles that are not filled in, is fed to the aluminum oxide layer 8, more precisely the surface 8a thereof. In the VUV lithography apparatus 1 of FIG. 1, the surface modifying reactant is fed in pulsed fashion and in the form of a boron trihalide, more precisely in the form of $BCl_3$, to the interior 122a of the housing 122 or the chamber of the illumination system 12. The VUV lithography apparatus 1 comprises a gas inlet 123 for the purposes of feeding $BCl_3$ into the interior 122a of the housing 122. The gas inlet 123, which is illustrated very schematically in FIG. 1, facilitates a controllable, pulsed feed of gases into the interior 122a and comprises a controllable valve 124 to this end. In analogous fashion, the wafer inspection system 2 illustrated in FIG. 2 also comprises a gas inlet 26, which renders it possible to feed a boron trihalide, in the form of $BBr_3$ in the example shown, to the interior 24a of the optical system 22 in a manner analogous to FIG. 1. The gas inlet 26 illustrated in FIG. 2 likewise comprises a controllable valve 27 in order to facilitate a pulsed feed of different gases into the interior 24a.

Figure 4B:
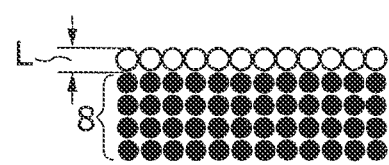

In the surface modification step shown in FIG. 4A, the surface modifying reactant in the form of the boron halide, which, as a rule, is not $BF_3$, is adsorbed at the surface 8a of the aluminum oxide layer 8, to be precise, this is typically only one atomic layer L of the surface modifying reactant, as may be identified in FIG. 4B. The use of boron halides containing chlorine or bromine as a reactant was found to be advantageous over the use of fluorine since the latter leads to reaction products that can damage other components in the respective interior 122a, 24a.

FIG. 4B shows the aluminum oxide layer 8 after the surface modification step and after a purge step following the surface modification step, within the scope of which the excess component of the surface modifying reactant, which has not been deposited on the surface 8a, is removed from the interior 122a, 24a with the aid of an inert purge gas, for example in the form of nitrogen. To remove the purge gas by suction, the housing 122, 24 is connected to a pump, not illustrated, or to a gas outlet.

After the adsorption of the boron halide BBr$_3$, BCl$_3$ and the following purge step, a material detaching reactant, which is chlorine gas (Cl$_2$) in the example shown, is fed to the interior 122a, 24a in pulsed fashion in a surface detachment step. As an alternative or in addition to Cl$_2$, further reactants can also be fed to the interior 122a, 24a, for example hydrogen or one or more of the noble gases like He, Ne, Kr, Ar, Xe. The material detaching reactant, which is symbolized by a circle with an R in FIG. 4C, is likewise adsorbed and enters into a chemical reaction with the boron halide adsorbed at the surface 8a and the top layer of the aluminum oxide layer 8 situated therebelow, said chemical reaction leading to the uppermost atomic layer L of the aluminum oxide layer 8 being detached.

Figure 4C:
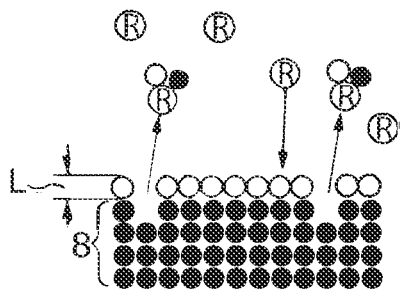
Figure 4D:
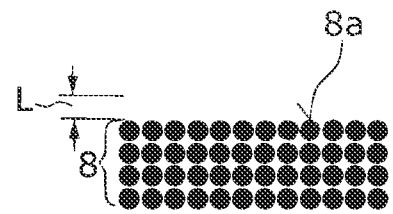

FIG. 4D shows the aluminum oxide layer 8 following a further purge step, within the scope of which the reaction product formed during the material detachment step and, possibly, the excess of the material detaching reactant present are removed from the interior 122a, 24a. As can be identified in FIG. 4D, exactly one atomic layer L of the aluminum oxide layer 8 was removed or ablated in the four steps of the atomic layer etching process described above.

To feed the boron halide as surface modifying reactant in the surface modification step, to feed, e.g., chlorine as material ablating reactant in the material detachment step and to feed the purge gas or gases, the respective gas inlet 123, 126 in each case has a gas reservoir (not illustrated here). The respective gas reservoir is connected to the controllable valve 124, 27 via a respective indicated feed line. A control device 9, for example in the form of a data processing apparatus or a computer, serves to control a respective valve 124, 27 in order to alternately feed the surface modifying reactant, the material detaching reactant, or a purge gas to the interior 122a, 24a.

To produce the chemical reaction in the material detachment step shown in FIG. 4C, it is typically not sufficient to bring the material detaching reactant into contact with the surface 8a. As a rule, it is necessary instead to overcome an activation energy, i.e., this is an energy-induced reaction. There are various options for introducing or supplying the energy required for the reaction.

Figure 3B:
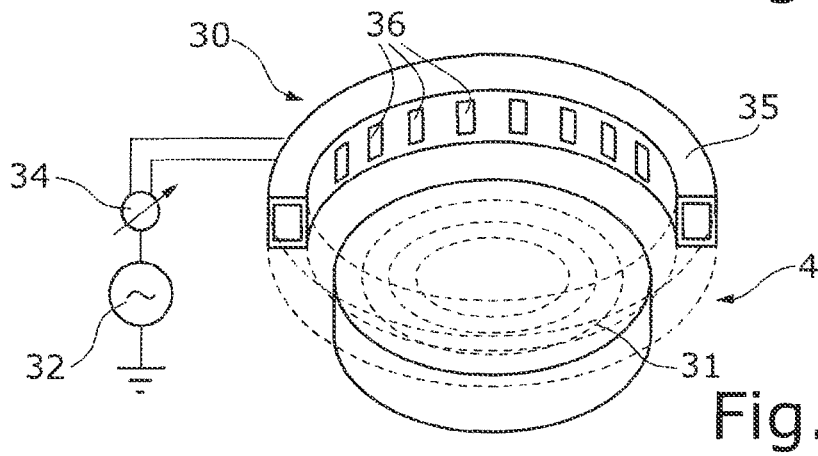

By way of example, the energy can be supplied with the aid of a pulsed plasma 31, which is produced in the interior 122a, 24a, more precisely on the surface 8a of the aluminum oxide layer 8, with the aid of a plasma source 30, as is illustrated in FIGS. 3A and 3B, for example. The plasma 31 is preferably produced in synchronized fashion with the feed of the material detaching reactant into the interior 122a, 24a, the synchronization being implemented with the aid of the control device 9.

In the example shown in FIG. 3A, the plasma source 30 is embodied to produce a remote plasma, i.e., the plasma source 30 is embodied for electrodeless plasma production. In the example shown in FIG. 3A, the plasma source 30 serves to generate an inductively coupled plasma 31 and to this end comprises a radiofrequency (RF) generator 32 and a coil 33, between which an impedance matching device 34 ("matching box") is arranged. By way of example, the RF generator 32 can produce frequencies of, e.g., approximately 13.56 MHz or 27.12 MHz. The RF generator can also be embodied to produce VHF waves at, e.g., 40.68 MHz, 60 MHz, 81.36 MHz, or 100 MHz, in order to produce the inductively coupled plasma 31 with the aid of the coil 33.

FIG. 3B shows a plasma source 30 which is embodied to produce a remote plasma in the form of a microwave surface wave plasma 31. The plasma source 30 comprises a microwave generator 32 and the above-described impedance matching device 34 in order to excite a hollow waveguide 35 surrounding the cylindrical optical element 4 in ring-shaped fashion. In the ring-shaped waveguide 35, of which only a section is illustrated in FIG. 3B, a plurality of azimuthally distributed slots 36 are applied to its inner side facing the optical element 4. The waveguide 35 with the slots 36 serves as an antenna for producing the surface wave plasma 31.

In principle, the plasma source 30 can also have a different embodiment in order to produce an inductively coupled plasma, a surface wave plasma, an (electron cyclotron resonance) microwave plasma, a helicon wave plasma, etc. In respect of details regarding the configuration of such plasma sources 30, reference is made to the articles by S. Shinohara and André Anders, respectively, cited at the outset.

To prevent the VUV radiation 11, 21 from interacting with the respective reactants, it is advantageous to carry out the above-described atomic layer etching process, in particular the surface modification step or the material detachment step, during the operating pauses of the respective optical arrangement 1, 2. By way of example, the mask 13 can be transported or exchanged during such an operating pause in the case of the VUV lithography apparatus 1 illustrated in FIG. 1. Correspondingly, the wafer 25 can be transported or exchanged in the case of the wafer inspection system 2 illustrated in FIG. 2. Where necessary, the atomic layer etching process or the respective steps of the atomic layer etching process can also be implemented during the pulse pauses of the respective VUV light source 10, 20 which is operated in pulsed fashion, so as to avoid an interaction of the VUV radiation 11, 21 with the reactants where possible.

The control device 9 is embodied to carry out the atomic layer etching process during a respective operating pause until the aluminum oxide layer 8 has reached a thickness D of less than approximately 5 nm. To this end, the control device 9 can carry out a predetermined number of cycles of the atomic layer etching process, said number having been determined, for example, with the aid of experiments carried out in advance. Optionally, at least one property of the reflective optical element 4, 121, 220, 221 that depends on the thickness D of the aluminum oxide layer 8 can be monitored, for example the reflectivity R, as illustrated in exemplary fashion in FIG. 2 for the second reflective optical element 221 of the optical system 22.

As may be identified in FIG. 2, measurement radiation in the VUV wavelength range is radiated onto the optical element 221 with the aid of the measurement radiation source 222 and the intensity of the measurement radiation reflected at the optical element 221 is detected with a detector 223 in order to determine or monitor the reflectivity R of the optical element 221. As an alternative to an optical measurement, it is also possible to monitor other properties of the optical element 4, 121, 220, 22, which are dependent on the thickness D of the aluminum oxide layer 8. By way of example, it is possible to monitor the conductivity of the surface 7a of the aluminum layer 7 or of the optical element 4, 121, 220, 221, which likewise depends on the thickness D of the aluminum oxide layer 8.

As an alternative to carrying out the atomic layer etching process during the operating pauses of the respective optical arrangement 1, 2, it is possible to carry out the atomic layer etching process, specifically the material detachment step, during the operation of the optical arrangement 1, 2, i.e., while the optical element 4, 121, 220, 221 is irradiated by VUV radiation 11, 21 from the respective light source 10, 20. The energy required for the chemical reaction in the material detachment step is supplied by the VUV radiation 11, 21 in this case, and so, as a rule, it is possible to dispense with the provision of a plasma source 30.

In this case, the atomic layer etching process can be subject to open-loop control, possibly closed-loop control, with the aid of the control device 9, within the scope of which control a dynamic equilibrium sets in between the ablation of the aluminum oxide layer 8 by the atomic layer etching process and the growth of the aluminum oxide layer 8 as a result of the oxidizing species present in the interior 112*a*, 24*a* or in the surroundings of the optical element 4, 121, 220, 221. In this way, it is possible to achieve a dynamic equilibrium state, in which the thickness D of the aluminum oxide layer 8 is permanently kept at less than 5 nm during the operation of the optical arrangement 1, 2. Since the energy supplied in the material detachment step is specified by the spectral characteristic and the power of the VUV radiation 11, 21 which is determined by the application or by the respective optical arrangement 1, 2, the control device 9 can suitably set the feed, more precisely the mass flow or the volumetric flow, supplied via the respective gas inlet 123, 26 and/or the pulse rate of the fed reactant or purge gas for the purposes of setting a desired etching rate.

Optionally, the control device 9 can also resort to the above-described monitored property of the reflective optical element 4, 121, 220, 221 in this case for the purposes of open-loop/closed-loop control of the atomic layer etching process. Alternatively, it is possible to control the atomic layer etching process or the etching rate on the basis of experiments carried out in advance such that the thickness D of the aluminum oxide layer 8 does not exceed a value of 5 nm and at least one atomic layer of the aluminum oxide layer 8 remains on the surface 7*a* of the aluminum layer 7. In all cases described above, care has to be taken that that surface 7*a* of the aluminum layer 7 is not etched during the atomic layers etching process in order to avoid a degradation of the optical properties of the respective reflective optical elements 4, 121, 220, 221.

What is claimed is:

1. A method for in situ dynamic protection of a surface of an aluminum layer of a vacuum ultraviolet (VUV) radiation reflecting coating of an optical element, which layer is arranged in an interior of an optical arrangement for a VUV wavelength range, against growth of an aluminum oxide layer, said method comprising:
   carrying out an atomic layer etching process for layer-by-layer removal of the aluminum oxide layer from the surface of the aluminum layer, wherein the atomic layer etching process comprises:
   a surface modification step and
   a material detachment step,
   wherein at least one boron halide is supplied as a surface modifying reactant to the interior in pulsed fashion during the surface modification step, and wherein a plasma is generated at a surface of the aluminum oxide layer in the interior, at least during the material detachment step,
   wherein the atomic layer etching process is carried out until the aluminum oxide layer reaches a thickness of less than 5 nm, or wherein the aluminum oxide layer is kept at a thickness of less than 5 nm by the atomic layer etching process.

2. The method as claimed in claim 1, wherein the plasma is generated in pulsed fashion.

3. The method as claimed in claim 1, wherein the plasma is generated as remote plasma.

4. The method as claimed in claim 3, wherein the remote plasma is selected from the group consisting essentially of: inductively coupled plasma, surface wave plasma, microwave plasma, and helicon wave plasma.

5. The method as claimed in claim 1, wherein the surface modification step and/or the material detachment step are carried out during an operating pause of the optical arrangement.

6. The method as claimed in claim 1, wherein at least the material detachment step is carried out while the optical element is irradiated by VUV radiation.

7. The method as claimed in claim 1, wherein at least one material-detaching reactant is supplied in pulsed fashion to the interior during the material detachment step.

8. The method as claimed in claim 7, wherein the at least one material-detaching reactant contains chlorine ($Cl_2$).

9. The method as claimed in claim 1, further comprising:
   monitoring at least one property of the reflective optical element that differs in accordance with the thickness of the aluminum oxide layer, and
   adjusting the atomic layer etching process based on the at least one monitored property.

10. The method as claimed in claim 9, wherein the at least one property of the reflective optical element is reflectivity of the optical element.

11. The method as claimed in claim 1, wherein $BBr_3$ and/or $BCl_3$ is supplied as a surface modifying reactant to the interior in pulsed fashion during the surface modification step.

* * * * *

UNITED STATES PATENT AND TRADEMARK OFFICE
CERTIFICATE OF CORRECTION

PATENT NO. : 11,525,946 B2
APPLICATION NO. : 17/340623
DATED : December 13, 2022
INVENTOR(S) : Shklover It is certified that error appears in the above-identified patent and that said Letters Patent is hereby corrected as shown below:

On the Title Page

Page 2, Column 2, Line 4, item[56], delete "A12O3" and insert -- Al2O3 --.

Page 2, Column 2, Line 8, item [56], delete "ulliaviolet" and insert -- ultraviolet --.

Page 2, Column 2, Line 11, item [56], delete "Microstructurers," and insert -- Microstructures, --.

Page 2, Column 2, Line 22, item [56], delete "Wpages." and insert -- 10 pages. --.

Page 2, Column 2, Line 24, item [56], delete "Transations," and insert -- Transactions, --.

In the Specification

Column 1, Line 7, delete "APPLICATION" and insert -- APPLICATIONS --.

Signed and Sealed this
Eleventh Day of July, 2023

*Katherine Kelly Vidal*

Katherine Kelly Vidal
*Director of the United States Patent and Trademark Office*